(12) United States Patent
Child (10) Patent No.: US 7,926,494 B2
(45) Date of Patent: Apr. 19, 2011

(54) BERNOULLI BLADE

(75) Inventor: Kent Riley Child, Los Banos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 229 days.

(21) Appl. No.: 11/831,600

(22) Filed: Jul. 31, 2007

(65) Prior Publication Data
US 2009/0032060 A1 Feb. 5, 2009

(51) Int. Cl.
*B08B 3/02* (2006.01)
(52) U.S. Cl. ............. 134/145; 134/61; 134/151; 294/92
(58) Field of Classification Search .................. None
See application file for complete search history.

(56) References Cited

U.S. PATENT DOCUMENTS

| | | | |
|---|---|---|---|
| 6,083,320 A * | 7/2000 | Lee | 118/58 |
| 6,913,302 B2 * | 7/2005 | Yokota et al. | 294/103.1 |
| 2003/0077162 A1 * | 4/2003 | Whitcomb | 414/754 |
| 2004/0012363 A1 * | 1/2004 | Simondet | 318/568.21 |
| 2005/0110291 A1 * | 5/2005 | Klein et al. | 294/64.1 |

* cited by examiner

*Primary Examiner* — Michael Barr
*Assistant Examiner* — Ryan Coleman
(74) *Attorney, Agent, or Firm* — Blakely Sokoloff Taylor & Zafman LLP (57) ABSTRACT

An end effector for a transport robot arm for a wafer wet cleaning system has an arm with a chuck at an end of the arm to support a wafer. The chuck also includes a cavity to spray a bottom surface of the wafer with a cleaning fluid. At least two branches extend from the chuck away from the arm with a roller at the end of each branch to hold the wafer. A spray bar is coupled to the arm. The spray bar is configured to hold and spray a top surface of the wafer with the cleaning fluid.

13 Claims, 12 Drawing Sheets

BERNOULLI BLADE

TECHNICAL FIELD

This invention relates to the field of semiconductor processing, and, in particular, to a support assembly.

BACKGROUND

In semiconductor wafer substrate (wafer) cleaning, particle removal is essential. Particles can be removed by chemical means or by mechanical means. In current state of the art, particles are usually removed by both a combination of mechanical means and chemical means. The current state of the art is to immerse a wafer into a bath filled with a liquid and to apply high frequency (megasonic) irradiation to the liquid. The sonic waves travel through the liquid and provide the mechanical means to remove particles from the wafer surface. At the same time, chemicals in the liquid provide a slight surface etching and provide the right surface termination, such that once particles are dislodged from the surface by the combination of etch and mechanical action of the sonics on the particles, these particles are not redeposited on the surface. In addition, chemicals are chosen such that an electrostatic repulsion exists between the surface termination of the wafer and the particles.

Wet etching and wet cleaning of wafers is usually done by immersing the wafers into a liquid. This can also be done by spraying a liquid onto a wafer or a batch of wafers. Wet wafer cleaning and etching is traditionally done in a batch mode. Because of the need for a shorter cycle time in chip manufacturing, there is a need for fast single wafer processing. Single wafer processing is usually limited to one side of the wafer. When cleaning wafers, it is important to clean both sides of the wafers at the same time.

It is also important to keep the wafer wet during transport from a wet cleaning chamber to a drying chamber so as to prevent dry residue deposits.

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

The transportation of wafers between different wafer processing chambers is typically held by a robot transport arm. When transporting the wafer, it is important to keep both sides of the wafer wet so as to prevent any residue deposits. In addition, the robot transport arm needs to be able to hold the wafer in different positions.

Figure 1:
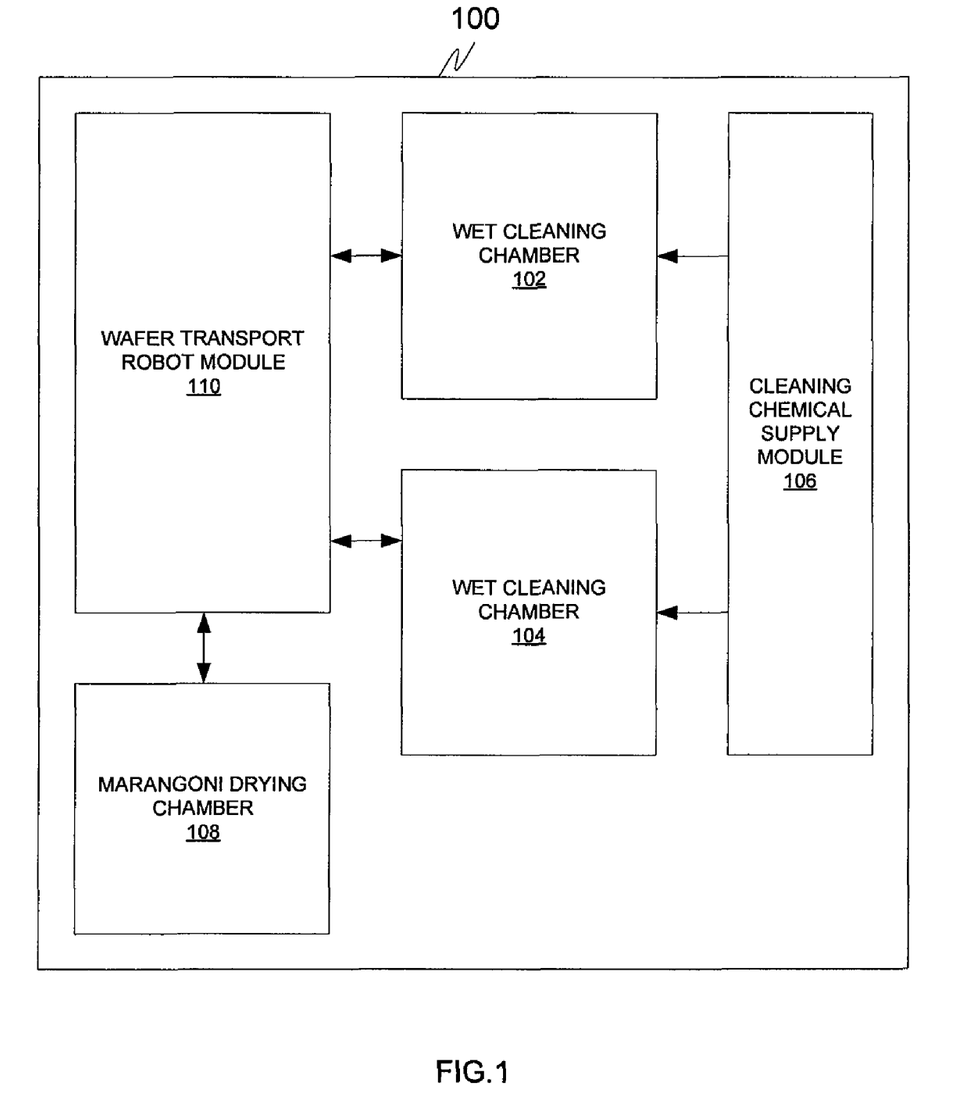
FIG. 1 is a schematic block diagram of a wafer processing system in accordance with one embodiment.

FIG. 1 is a schematic block diagram of a wafer processing system. In particular, FIG. 1 illustrates a wet wafer cleaning system 100 comprising several components or modules: one or more wet cleaning chambers 102, 104, a chemical supply chamber 106 for supplying the cleaning components to the wet cleaning chambers 102 and 104, a wafer drying chamber 108, and a transport robot module 110 for transporting wafers from the wet cleaning chambers 102, 104 to the wafer drying chamber 108.

The wet cleaning chambers 102 may be used to clean wafers being processed with several types of fluid and gas as provided by the chemical supply chamber 106. The cleaning process in the wet cleaning chambers 102 is well known to those of ordinary skills in the art.

The drying chamber 108 may to be used to dry the wet wafers from the wet cleaning chambers 102. The drying technique may include supplying a dry gas to a wafer and heating the wafer while removing it from a bath after dipping it. In accordance with one embodiment, the drying chamber 108 may include a Marangoni dryer as known to those of ordinary skills in the art.

Figure 2:
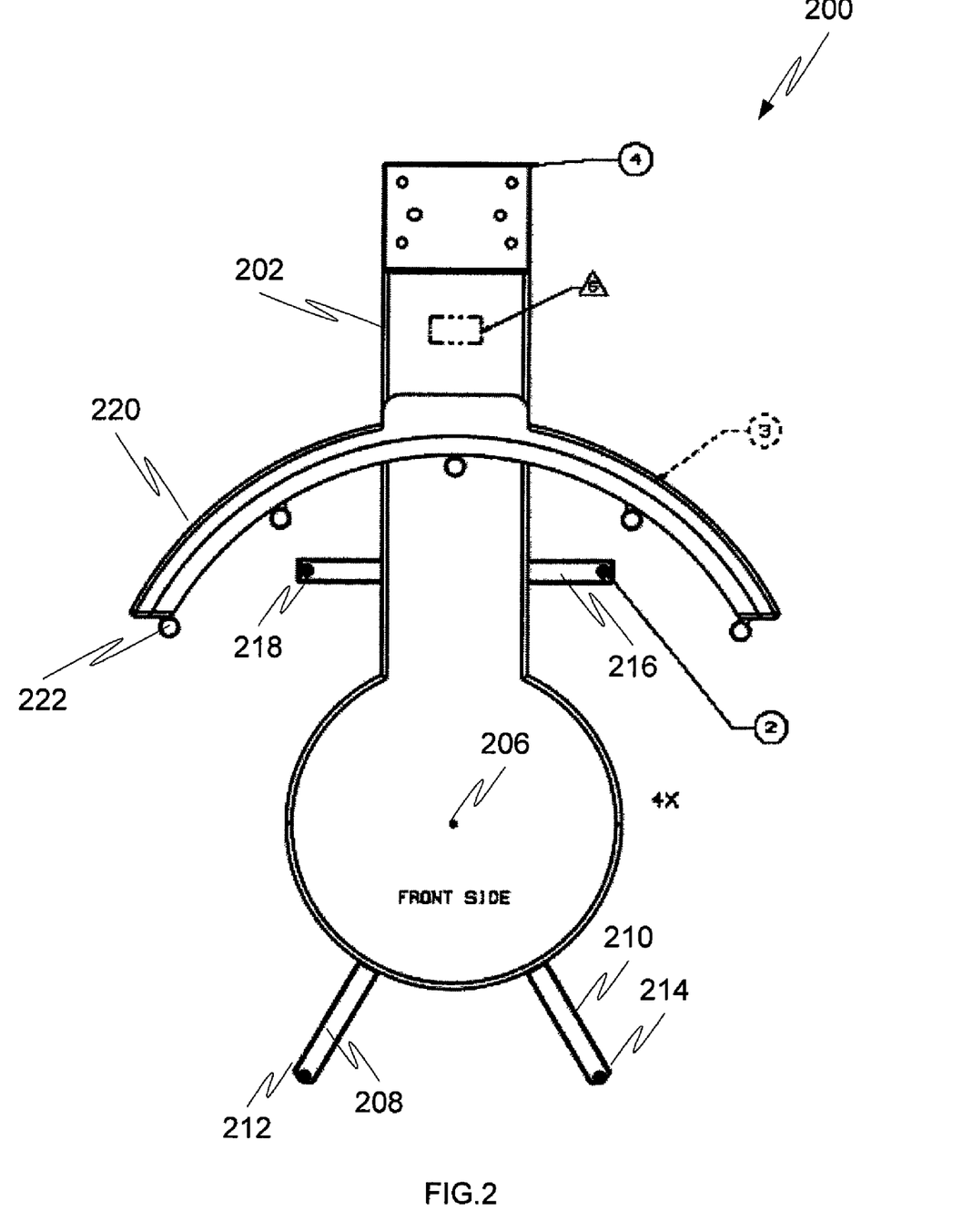
FIG. 2 is a top view of an end effector of a robot arm of a wafer processing system in accordance with one embodiment.

FIG. 2 is a top view of an end effector 200 of wafer transport robot module 110 of the wafer processing system 100 of FIG. 1. End effector 200 may include an arm 202 extending from a base (not shown) of the wafer transport robot module 110. Arm 202 may include a support, such as a plate or a chuck 204 at one end of arm 202. Chuck 204 may be configured to support and hold a wafer (not shown). A cavity 206 may be disposed in the center of chuck 204 to spray a cleaning fluid to a bottom surface of the wafer.

Two branches 208, 210 or antennas may extend away from chuck 204 and away from arm 202. The end of each branch may be configured to hold the wafer during transport and during the drying process. In accordance with one embodiment, the end of each branch may include a branch roller configured to hold and support the wafer against chuck 204. In particular, when end effector 200 is positioned at an angle with respect to the horizon, the wafer may rest on branch rollers 212, 214.

Arm 202 may further include a support bar 216 transversal to an axis of arm 202. The ends of the support bar may include a support 218 for supporting the wafer.

Figure 3:
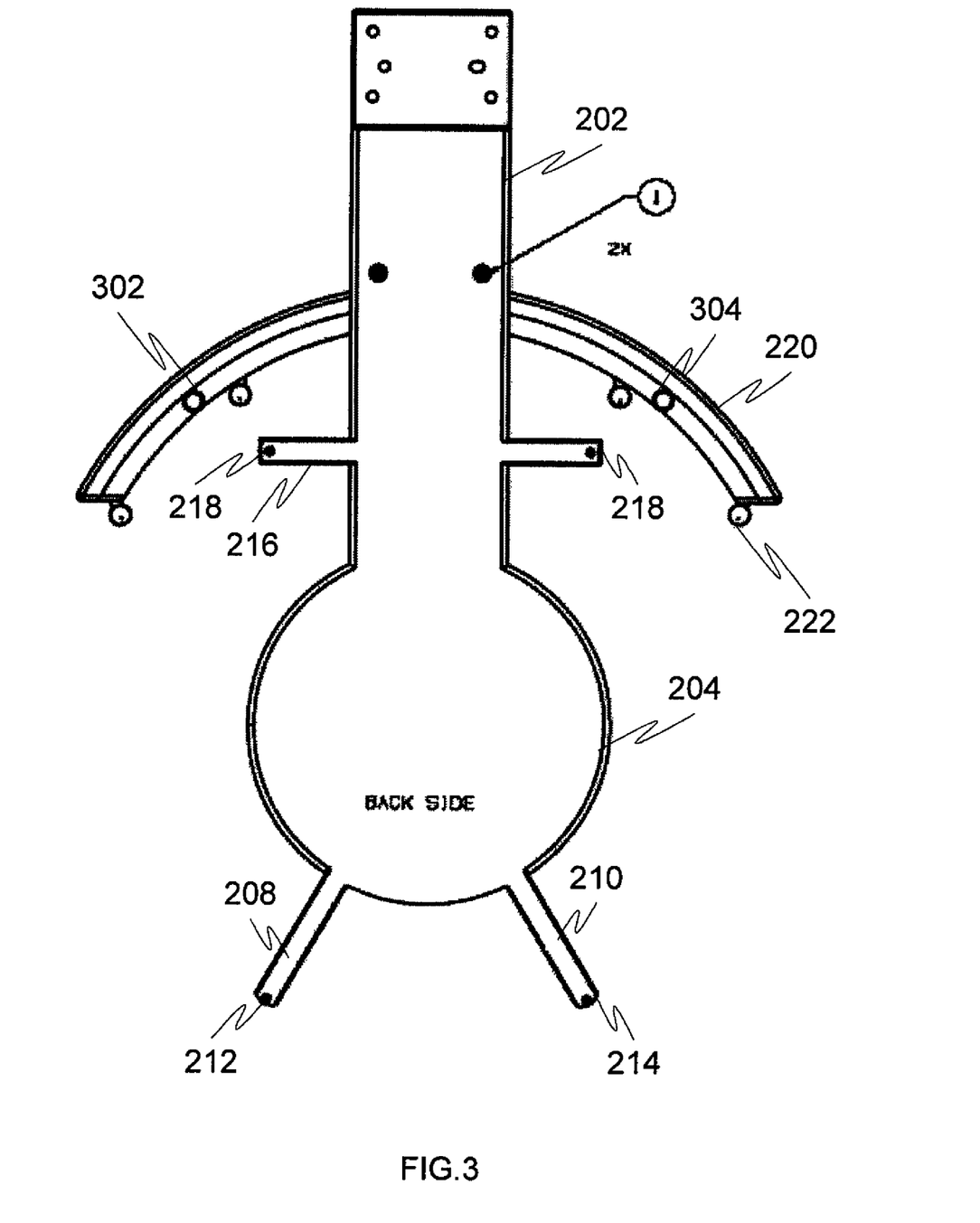
FIG. 3 is a bottom view of the end effector of FIG. 2.

In accordance with one embodiment, a spray bar 220 may be coupled to arm 202. Spray bar 220 may have a curvature concentric to the curvature of the wafer. Spray bar 220 may be configured to hold and spray a top surface of the wafer placed on chuck 204. Spray bar 220 may be also configured to hold and support the wafer with at least two bar rollers 302, 304. In one embodiment branch rollers 212, 214 may be the same as bar rollers 302, 304. All rollers 212, 214, 302, and 304 may be configured to hold an edge of the wafer, or in particular, a bevel edge of the wafer.

Several spray nozzles 222 may be coupled to spray bar 220 and positioned such as to spray the top surface of the wafer placed on chuck 204 with the cleaning fluid. FIG. 2 illustrates one embodiment where five spray nozzles 222 are coupled to the spray bar 220.

The cleaning fluid may include a cleaning solution to clean and maintain the wafer wet during transport from wet cleaning processing chamber 102, 104 to Marangoni drying chamber 108. The cleaning fluid may have the same chemistry as the cleaning fluid used in the wet cleaning processing chamber 102, 104.

FIG. 3 is a bottom view of the end effector of FIG. 2. Rollers 302, 304 are shown coupled to spray bar 220. The opening of each spray nozzle 222 is also shown in FIG. 3.

Figure 4:
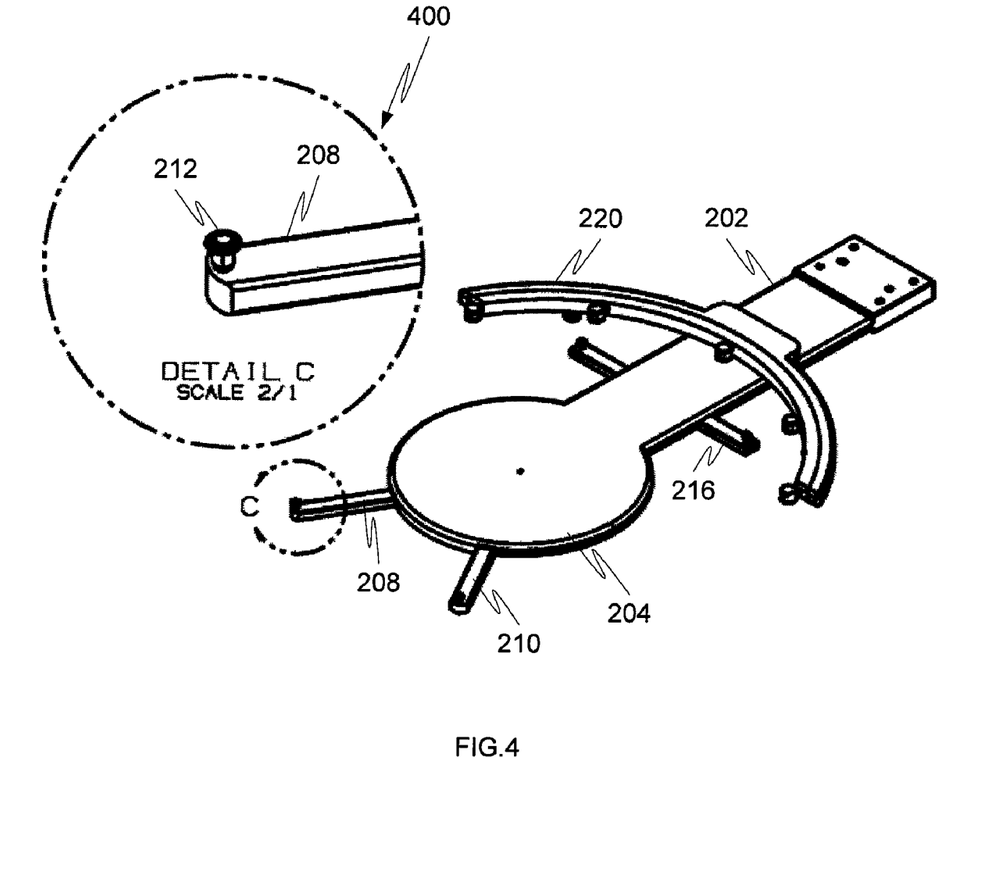
FIG. 4 is a top perspective view of the end effector of FIG. 2.
Figure 5:
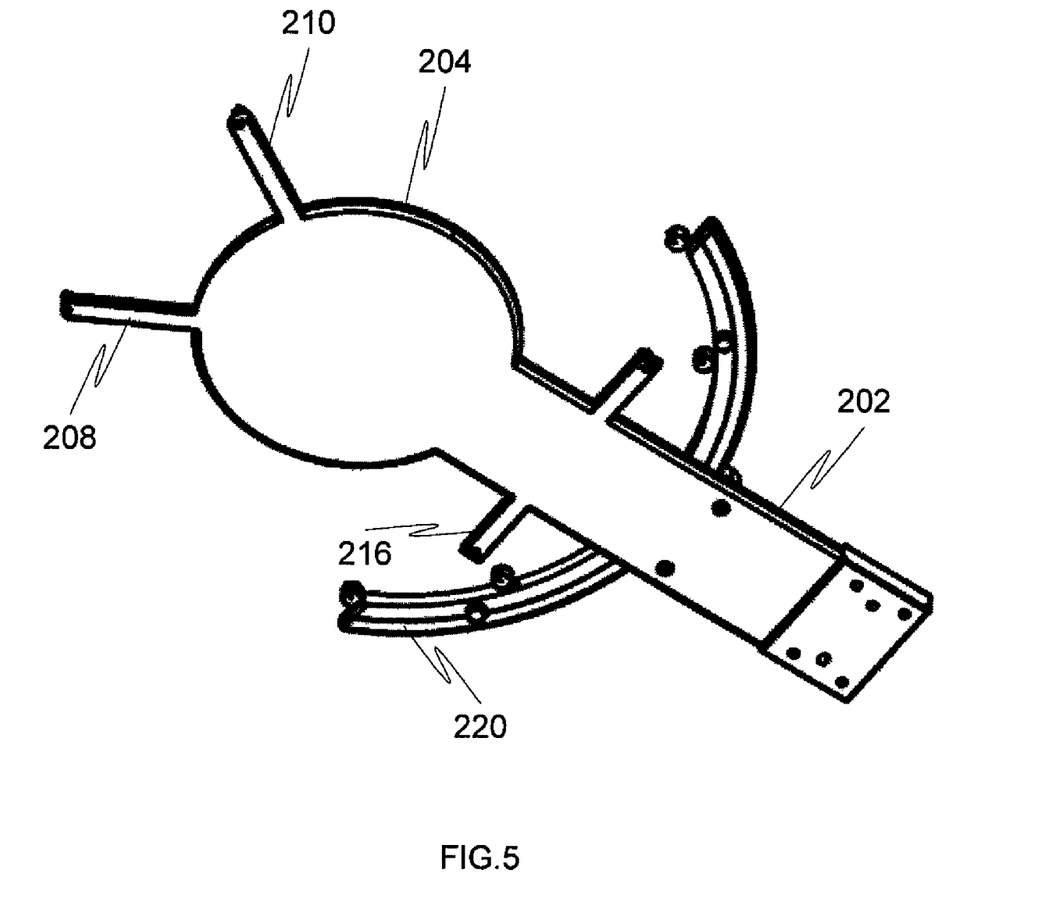
FIG. 5 is a bottom perspective view of the end effector of FIG. 2.

FIG. 4 is a top perspective view of the end effector and FIG. 5 is a bottom perspective view of the end effector. A detailed view of one embodiment of roller 212 is illustrated in 400. As shown, roller 212 prevents the wafer from leaving chuck 204. However, roller 212 allows the wafer to rotate on chuck 204. A head on top of roller 212 prevents the wafer from popping out of chuck 204.

Figure 6:
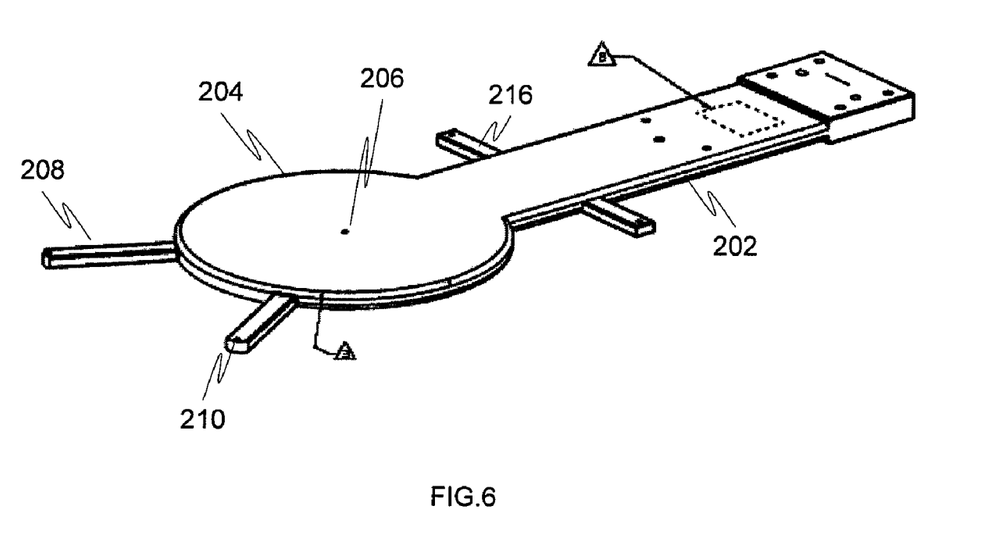
FIG. 6 is a top perspective view of the arm of the end effector of FIG. 2
Figure 7:
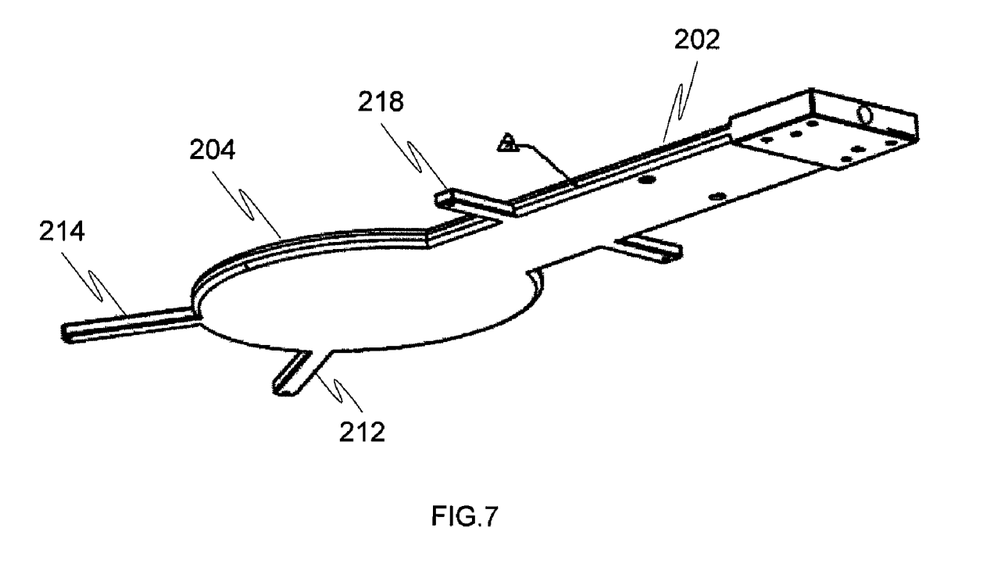
FIG. 7 is a bottom perspective view of the arm of the end effector of FIG.

FIG. 6 is a top perspective view of the arm of the end effector and FIG. 7 is a bottom perspective view of the arm of the end effector.

Figure 8:
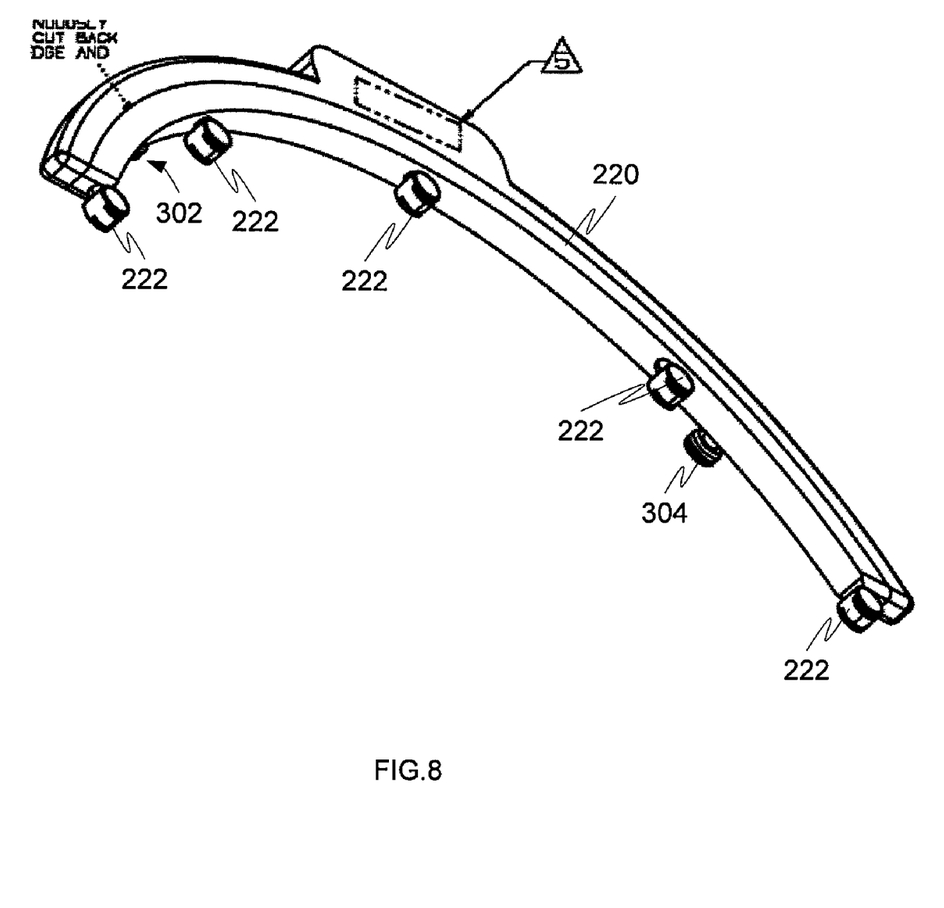
FIG. 8 is a top-sectional view of the spray bar of the end effector of FIG. 2.
Figure 9:
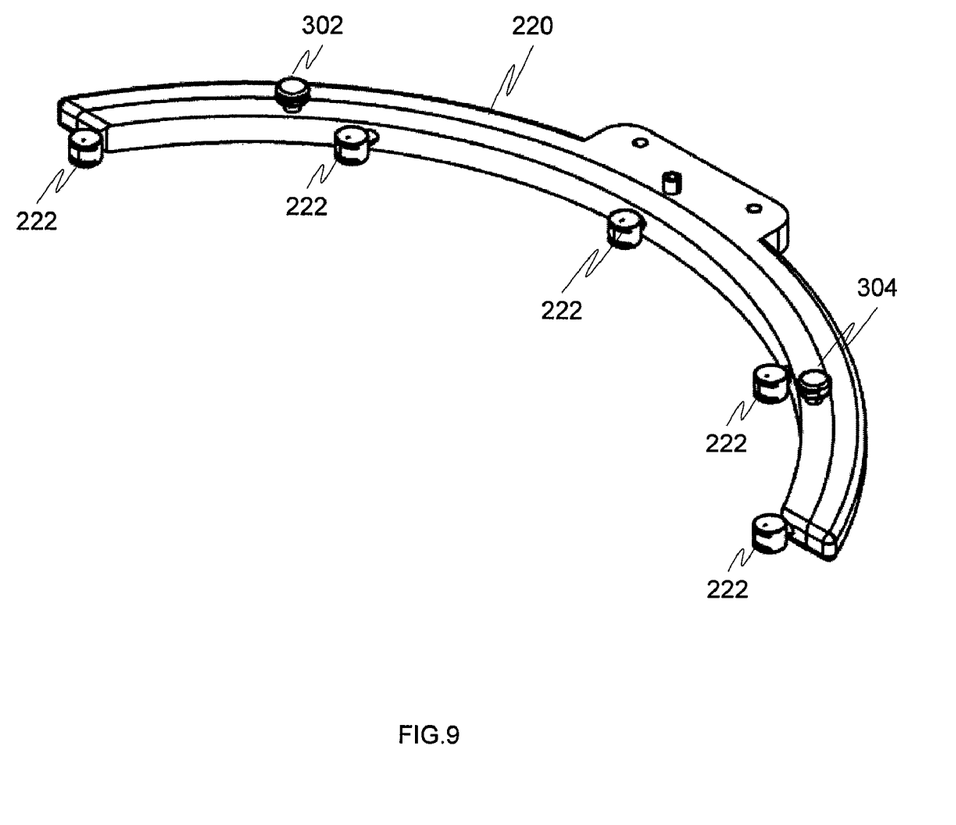
FIG. 9 is a bottom-sectional view of the spray bar of the end effector of FIG. 2.

FIG. 8 is a top-sectional view of the spray bar of the end effector and FIG. 9 is a bottom-sectional view of the spray bar of the end effector.

Figure 10:
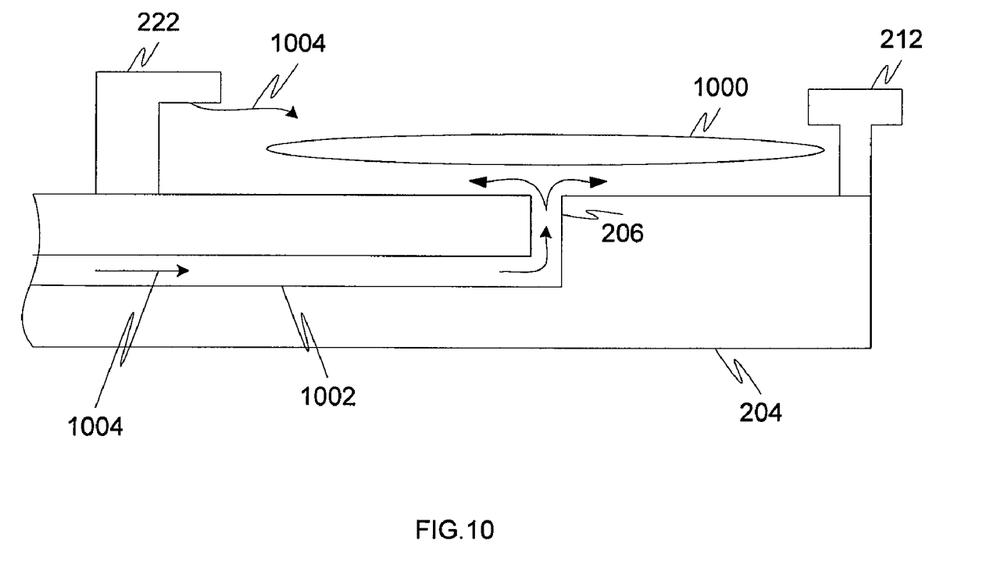
FIG. 10 is a schematic diagram of a cross-sectional view of the end effector of FIG. 2.

FIG. 10 is a schematic diagram of a cross-sectional view of the end effector of FIG. 2. Chuck 204 supports a wafer 1000. Chuck 204 may include a channel 1002 that is connected to the spray opening 206. Channel 1004 supplies a cleaning fluid 1004 to spray the bottom surface of wafer 1000 to maintain wafer 1000 wet. Roller 212 holds and maintain wafer 1000 on chuck 204. Spray nozzles 222 also may hold and maintain wafer 1000 on chuck 204. Further, spray nozzles 222 may be configured to spray cleaning fluid 1004 onto the top surface of wafer 1000 to keep wafer 1000 wet.

In accordance with one embodiment, the cleaning fluid 1004 from the spray opening 206 may flow radially away from the center of the wafer 1000 and meet with the cleaning fluid 1004 from the spray nozzles 222.

Figure 11:
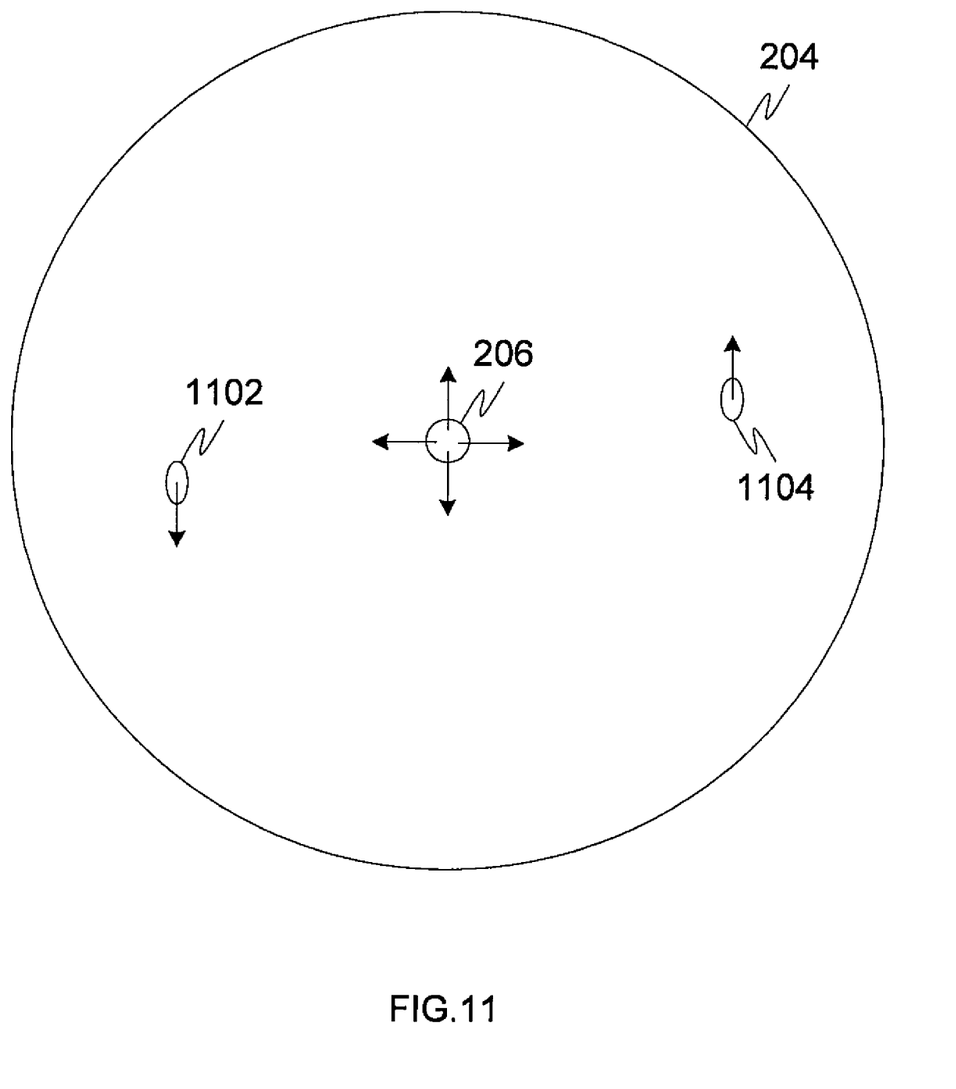
FIG. 11 is a top view of an end effector of a transport robot arm of a wafer processing system in accordance with another embodiment.

FIG. 11 is a top view of an end effector of a transport robot arm of a wafer processing system in accordance with another embodiment. Chuck 204 may include in addition several openings to further create and agitate fluid turbulence on the bottom of the wafer. For example, FIG. 11 illustrates a chuck 204 having two additional spray openings 1102, 1104. The spray openings 1102 and 1104 may be configured to spray the cleaning fluid in a tangential direction to the chuck 204. Cleaning fluid may flow radially outward from the center spray 206. The combined flow may promote further cleaning but also may help maintain the wafer against the chuck by creating a Bernoulli effect.

Figure 12:
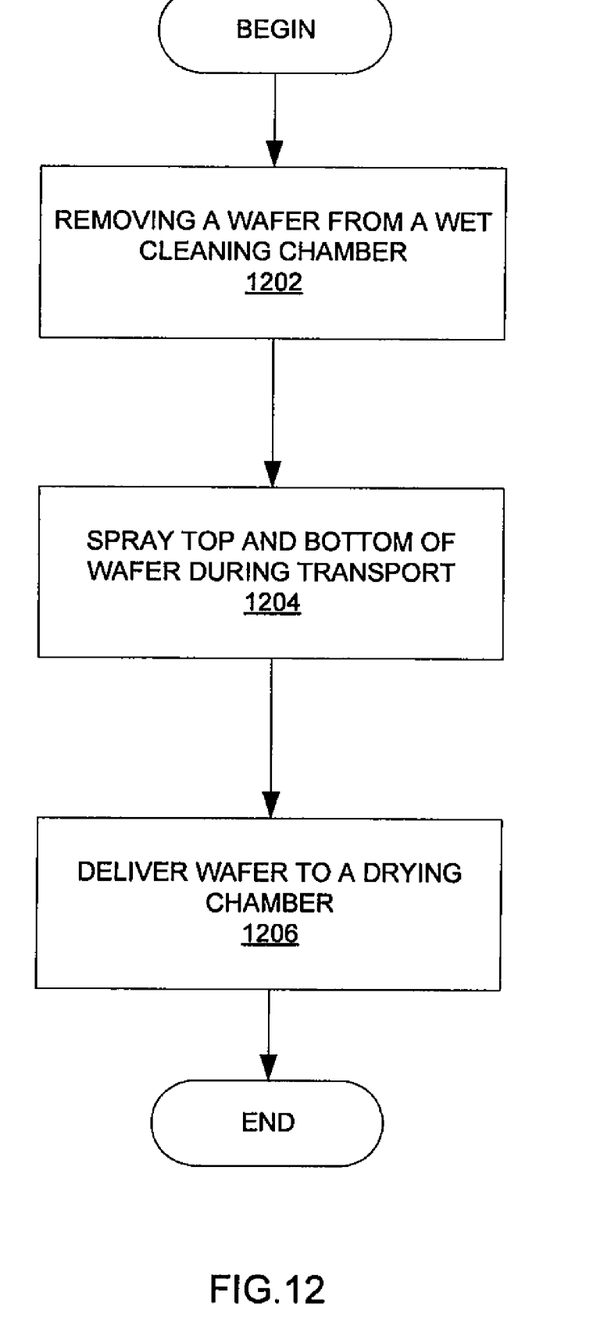
FIG. 12 is a flow diagram of a method for keeping a wafer wet during a transport in accordance with one embodiment.

FIG. 12 is a flow diagram of a method for keeping a wafer wet during a transport in accordance with one embodiment. At 1202, a wafer is removed from the wet cleaning chamber in horizontal position. At 1204, the top and bottom of the wafer are maintained wet during transport by a robot transport module. The robot transport module may deliver the wafer to the drying chamber at 1206 in a non-horizontal position.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An end effector comprising:
   an arm having a plate shaped chuck at a first end to support a wafer;
   a cavity disposed in a center of the chuck to spray a wet cleaning fluid to a bottom surface of the wafer;
   at least two branches extending from the chuck away from the arm, an end of each branch to hold the wafer;
   a branch roller coupled to the end of each branch; and
   a bar coupled to a second end of the arm opposite the first end, the bar to hold the wafer and a plurality of spray nozzles coupled to the bar to spray a wet cleaning fluid to a top surface of the wafer.

2. The end effector of claim 1 further comprising:
   at least two bar rollers coupled to the bar, wherein the branch rollers and the bar rollers are configured to hold an edge of the wafer.

3. The end effector of claim 1 wherein the bar has a curvature concentric to the wafer.

4. The end effector of claim 1 wherein the wet cleaning fluid sprayed on the bottom surface of the wafer comprises a wafer cleaning solution.

5. The end effector of claim 1 wherein the chuck further comprises at least two tangential sprays disposed along a diameter axis of the chuck, the tangential sprays to spray the fluid and to form a shearing effect on the backside of the wafer.

6. The end effector of claim 1 wherein the arm is configured to move from a horizontal position to an angled position with respect to the horizontal position, the arm is in the horizontal position to support the wafer and to remove the wafer from a first processing chamber, the arm is in the angled position to supply the wafer to a second processing chamber.

7. The end effector of claim 6 wherein the first processing chamber includes a wet clean chamber, and the second processing chamber includes a drying chamber.

8. A system for processing a wafer comprising:
   a wet cleaning chamber;
   a dry cleaning chamber;
   a transport robot having an end effector, wherein the end effector comprises:
   an arm having a chuck at a first end to support a wafer;
   a cavity disposed in a center of the chuck to spray a wet cleaning fluid on a bottom surface of the wafer;
   at least two branches extending from the chuck away from the arm, an end of each branch to hold the wafer;
   a branch roller coupled to the end of each branch; and a bar coupled to a second end of the arm opposite the first end, the bar to hold the wafer and a plurality of spray nozzles are coupled to the bar to spray a wet cleaning fluid to a top surface of the wafer.

9. The system of claim 8 wherein the end effector further comprises:
at least two bar rollers coupled to the bar, wherein the branch rollers and the bar rollers are configured to hold an edge of the wafer.

10. The system of claim 8 wherein the bar has a curvature concentric to the wafer.

11. The system of claim 8 wherein the wet cleaning fluid sprayed on the bottom surface of the wafer comprises a wafer cleaning solution.

12. The system of claim 8 wherein the chuck further comprises at least two tangential sprays disposed along a diameter axis of the chuck, the tangential sprays to spray the fluid and to form a shearing effect on the backside of the wafer.

13. The system of claim 8 wherein the transport robot is configured to move the end effector from a horizontal position to an angled position with respect to the horizontal position, the end effector is in the horizontal position to support the wafer and to remove the wafer from the wet cleaning chamber, the end effector is in the angled position to supply the wafer to the dry cleaning chamber.

* * * * *